US011011692B2

(12) United States Patent
Heremans et al.

(10) Patent No.: US 11,011,692 B2
(45) Date of Patent: May 18, 2021

(54) THERMOELECTRIC DEVICE UTILIZING NON-ZERO BERRY CURVATURE

(71) Applicant: Ohio State Innovation Foundation, Columbus, OH (US)

(72) Inventors: Joseph P. Heremans, Upper Arlington, OH (US); Sarah Watzman, Cincinnati, OH (US); Nandini Trivedi, Columbus, OH (US); Timothy McCormick, Ashburn, VA (US); Claudia Felser, Halle (DE)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 16/157,522

(22) Filed: Oct. 11, 2018

(65) Prior Publication Data

US 2020/0028060 A1    Jan. 23, 2020

Related U.S. Application Data

(60) Provisional application No. 62/570,782, filed on Oct. 11, 2017.

(51) Int. Cl.
*H01L 37/00* (2006.01)
(52) U.S. Cl.
CPC .................................. *H01L 37/00* (2013.01)
(58) Field of Classification Search
CPC .......... H01L 37/00; H01L 35/12; H01L 35/14
See application file for complete search history.

(56) References Cited

U.S. PATENT DOCUMENTS

| | | | | |
|---|---|---|---|---|
| 6,653,548 | B2 * | 11/2003 | Yamashita | H01L 35/18 136/201 |
| 2010/0139730 | A1 * | 6/2010 | Bentien | C30B 15/00 136/201 |
| 2016/0372650 | A1 * | 12/2016 | Ghoshal | F25B 21/02 |
| 2018/0366633 | A1 * | 12/2018 | Fu | H01L 35/32 |
| 2019/0067547 | A1 * | 2/2019 | Gooth | H01L 35/00 |

OTHER PUBLICATIONS

Chen et al. "Thermoelectric transport in double-Weyl semimetals". Phys. Rev. B 93, 155125. Apr. 14, 2016. (Year: 2016).*
Lundgren et al. "Thermoelectric properties of Weyl and Dirac semimetals". Phys. Rev. B 90, 165115. 2014. (Year: 2014).*
Das et al. "Berry curvature induced thermopower in type-I and type-II Weyl semimetals". Phys. Rev. B 100, 085406. 2019. (Year: 2019).*

\* cited by examiner

*Primary Examiner* — Tamir Ayad
(74) *Attorney, Agent, or Firm* — Wood Herron & Evans LLP

(57) ABSTRACT

Thermoelectric devices and methods of using thermoelectric devices. A thermoelectric device includes a thermoelectric element comprised of a material having a non-zero Berry curvature. The device may operate as a Nernst generator that generates electricity in response to application of a temperature gradient to the thermoelectric element, or as an Ettingshausen cooler that pumps heat into or out of an object to be heated or cooled in response to application of a current to the thermoelectric element. In either application, the non-zero Berry curvature of the material allows the device to operate without an externally applied magnetic field.

5 Claims, 11 Drawing Sheets

THERMOELECTRIC DEVICE UTILIZING NON-ZERO BERRY CURVATURE

This application claims the benefit of U.S. Application No. 62/570,782 filed on Oct. 11, 2017 and entitled "Thermoelectric Device Using Weyl Semimetal", the disclosure of which is incorporated by reference herein in its entirety.

BACKGROUND

It is estimated that in 2017, the United States consumed 97.7 quads providing for its residential, commercial, industrial, and transportation energy needs. Approximately 80% of this energy was produced by fossil fuels such as petroleum (37.1%), natural gas (28.7%), and coal (14.3%). Nuclear power (8.62%) and biomass (5.03%) accounted for another 13.7% of the energy produced. The approximately 6% remaining was generated from sources such as hydroelectric, wind, geothermal, and solar. Of the energy consumed, it is further estimated that only 32% produced useful work, with the remaining 68% being rejected into the environment as waste heat. Transportation applications are particularly inefficient, with about 79% of the energy consumed producing waste heat. Recovery of even a portion of this waste heat could significantly reduce the amount of energy consumed.

Attempts to recover energy from waste heat include using the heat to generate electricity. For example, waste heat may be used to vaporize liquids or heat gases that are provided to an engine which powers an electric generator. Another approach to generating electricity from waste heat is to use the waste heat to produce a temperature gradient across a thermoelectric device that produces electricity through a thermoelectric effect.

Thermoelectric devices include thermoelectric generators, Peltier devices, and Nernst/Ettingshausen devices. Conventional thermoelectric devices include thermoelectric generators that generate electricity from a temperature gradient and Peltier devices such as thermoelectric heat-pumps (also referred to as Peltier coolers or thermoelectric coolers) that use an applied current to generate a temperature gradient. Thermoelectric generators and Peltier devices have a longitudinal geometry in which the temperature gradient and induced voltage run parallel to one another. Conventional longitudinal thermoelectric devices require both n-type and p-type materials electrically connected in series and thermally connected in parallel. To increase efficiency, Peltier devices are often cascaded (e.g., stacked with increasingly smaller surface areas on top) as shown in FIG. 1. The need for electrical connections between the n-type and p-type materials, as well as the need for this cascading in Peltier devices, add to the cost and complexity of conventional, longitudinal thermoelectric devices.

Nernst/Ettingshausen devices are solid-state devices where an applied temperature gradient and perpendicular magnetic field generate a mutually orthogonal voltage, or an applied current and perpendicular magnetic field generate a mutually orthogonal temperature gradient. The magnetic field generates a skew force (Lorentz force) that accelerates charge carriers in a direction perpendicular to the temperature gradient in the device. As with Peltier devices, Nernst/Ettingshausen devices include thermoelectric heat-pumps (also referred to as Ettingshausen coolers) that use an applied current to generate a temperature gradient, and thermoelectric generators (also referred to as Nernst generators) that generate electricity from a temperature gradient. Nernst/Ettingshausen devices utilize a transverse geometry and thus only require one polarity of material.

To increase efficiency, Nernst/Ettingshausen devices may be shaped as shown in FIG. 2. Because the shaping is done on the thermoelectric material itself, this technology is more simplistic than that of Peltier devices and eliminates losses due to the multiple electrical connections of n-type and p-type thermoelectric materials. However, unlike Peltier devices, conventional Nernst/Ettingshausen devices require an externally applied magnetic field that is orthogonal to the electrical current and temperature gradient. The magnetic fields used in conventional Nernst/Ettingshausen devices must be relatively intense, which can make Nernst/Ettingshausen devices impractical for commercial applications.

Thus, there is a need for improved thermoelectric devices and methods of using thermoelectric devices to provide thermoelectric electricity generation and/or cooling with improved efficiency that do not require different types of materials or intense externally applied magnetic fields.

SUMMARY

In an embodiment of the invention, a thermoelectric device is provided comprising a thermoelectric element including a material having a non-zero Berry curvature.

In an aspect of the invention, the thermoelectric element may be configured to generate a voltage in response to being exposed to a temperature gradient.

In another aspect of the invention, the thermoelectric element may be configured to generate a temperature gradient in response to application of an electrical current.

In another aspect of the invention, the non-zero Berry curvature may be along an axis of the material orthogonal to a temperature gradient to which the thermoelectric element is exposed or the thermoelectric element generates.

In another aspect of the invention, the thermoelectric element may have a first side, a second side located a first distance from the first side along a first dimension, a third side that intersects the first and second sides, and a fourth side located a second distance from the third side along a second dimension orthogonal to the first dimension and that intersects the first and second sides. The thermoelectric device may further include a first thermal coupler configured to thermally couple the first side to a heat source and a second thermal coupler configured to thermally couple the second side to a heat sink. A voltage may be generated between the third and fourth sides in response to application of a temperature gradient between the first thermal coupler and the second thermal coupler.

In another aspect of the invention, the thermoelectric device may include a magnet configured to provide a magnetic field to the thermoelectric element.

In another aspect of the invention, the thermoelectric device may be one of a Ettingshausen cooler or a Nernst generator.

In another aspect of the invention, the material may be a Weyl semimetal.

In another aspect of the invention, the Weyl semimetal may break time-reversal symmetry.

In another embodiment of the invention, a method of generating electricity is provided. The method includes providing a temperature gradient across a thermoelectric element including a material having a non-zero Berry curvature.

In an aspect of the invention, providing the temperature gradient across the thermoelectric element may include coupling the first side of the thermoelectric element to the heat source and coupling the second side of the thermoelectric element to the heat sink, wherein the second side may be located the first distance from the first side along the first dimension.

In another aspect of the invention, the method may further include applying the magnetic field to the thermoelectric element.

In another aspect of the invention, the method may include orienting the thermoelectric element so that the axis of the material having the non-zero Berry curvature is orthogonal to the temperature gradient.

In another embodiment of the invention, a method of generating a temperature gradient is provided. The method includes passing a current through the thermoelectric element including the material having the non-zero Berry curvature.

In another aspect of the invention, generating the temperature gradient may include coupling the first side of the thermoelectric element to the heat sink, and coupling the second side of the thermoelectric element to an object to be cooled or warmed, wherein the second side is located the first distance from the first side along the first dimension.

In another aspect of the invention, the method may include applying the magnetic field to the thermoelectric element.

In another aspect of the invention, passing the current through the thermoelectric element from the third side to the fourth side may cool the object, and passing the current from the fourth side to the third side may warm the object.

In another aspect of the invention, the method may include orienting the thermoelectric element so that the axis of the material having the non-zero Berry curvature is orthogonal to the temperature gradient and the current.

The above summary presents a simplified overview of some embodiments of the invention to provide a basic understanding of certain aspects of the invention discussed herein. The summary is not intended to provide an extensive overview of the invention, nor is it intended to identify any key or critical elements, or delineate the scope of the invention. The sole purpose of the summary is merely to present some concepts in a simplified form as an introduction to the detailed description presented below.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Conventional thermoelectric devices use a longitudinal geometry and depend on the Seebeck effect to generate electricity from waste heat. Thermoelectric devices having transverse geometries have significant advantages in cost and complexity over those having a longitudinal geometry. However, because conventional transverse thermoelectric devices depend on the Nernst effect to generate electricity, they normally need a large externally applied magnetic field to function. Embodiments of the invention provide the advantages of transverse geometries in thermoelectric devices having little or no need for an external magnetic field. This improvement in thermoelectric devices has been achieved by using thermoelectric materials that have a non-zero Berry curvature, such as found in certain Weyl semimetals.

A Weyl semimetal is a material having inverted conduction and valence bands where the bands are linear Dirac bands near the crossing points. The breaking of time-reversal symmetry or spatial-inversion symmetry may lift the degeneracy of the band crossing points, giving rise to pairs of Weyl nodes. Separated Weyl nodes may result when the electron band structure of the material has singly degenerate bands that include bulk band crossings known as "Weyl points". Electrons around the Weyl points have a property called Berry curvature $\Omega_z$ that behaves like an internal magnetic field. The Berry curvature $\Omega_z$ may give electrons an additional velocity that is normal to the direction of their momentum. One Weyl semimetal that breaks time-reversal symmetry and has a non-zero Berry curvature is $YbMnBi_2$. A thermoelectric device made from $YbMnBi_2$ in accordance with an embodiment of the invention has demonstrated previously unknown thermoelectric efficiency in a transverse geometry without the need for an externally applied magnetic field. Use of materials having non-zero Berry curvatures thereby provides transverse thermoelectric devices with significant advantages in cost and reliability over conventional devices.

Embodiments of the invention may utilize the transverse geometry and cascaded shape of conventional Nernst/Ettingshausen devices, but do not require an externally applied magnetic field. Weyl semimetals having a non-zero net Berry curvature may be used to form these new Nernst/Ettingshausen devices. The non-zero Berry curvature may act as an intrinsic magnetic field in k-space, generating a skew force to the applied current and thus inducing a temperature gradient. Materials with a non-zero Berry curvature may allow thermoelectric devices to be built with the simplicity of the Nernst/Ettingshausen geometry without the need for an externally applied magnetic field. Thermoelectric devices made in accordance with embodiments of the invention also provide previously unheard of thermoelectric figures of merit in a transverse geometry.

Figure 1:
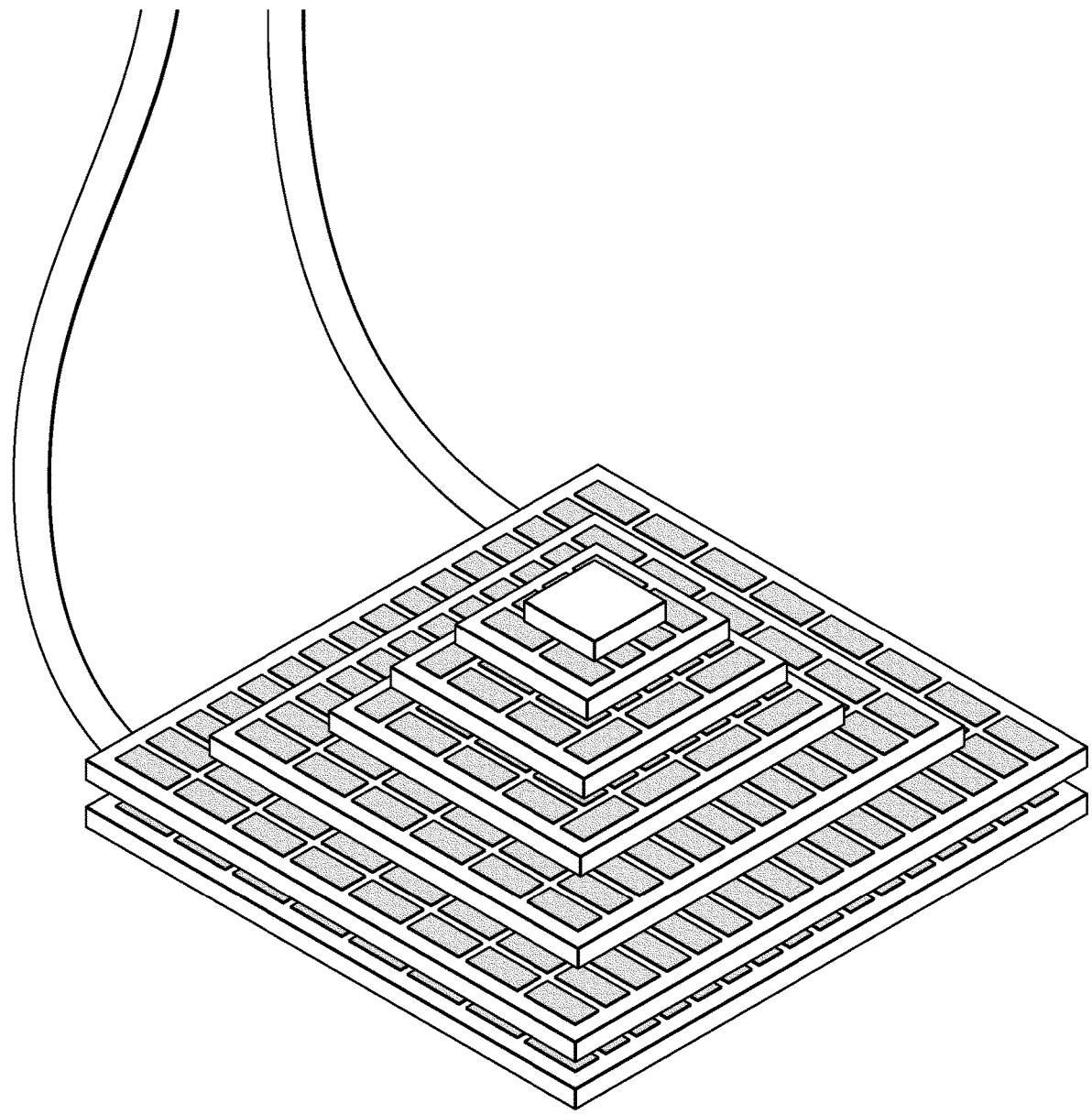
FIG. 1 is an isometric view of a Peltier device having a cascaded configuration.
Figure 2:
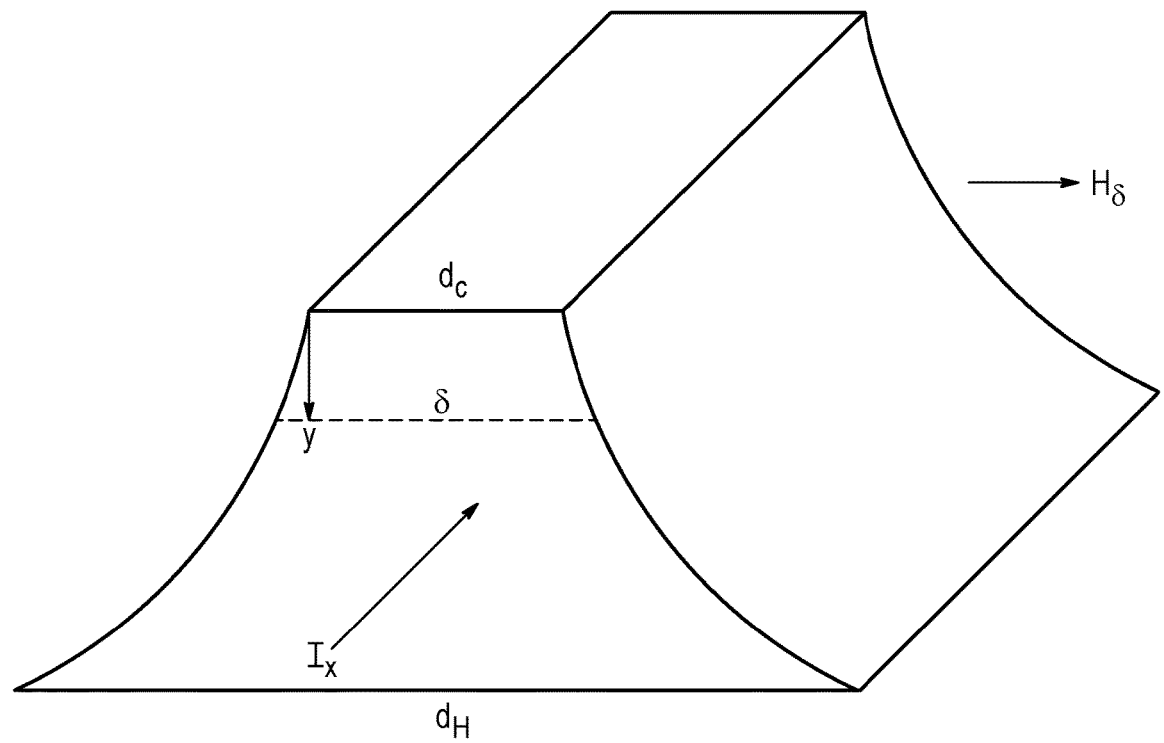
FIG. 2 is an isometric view of an Nernst/Ettingshausen device configured to have a cross-sectional area that varies along the length of a temperature gradient applied across the device.
Figure 3:
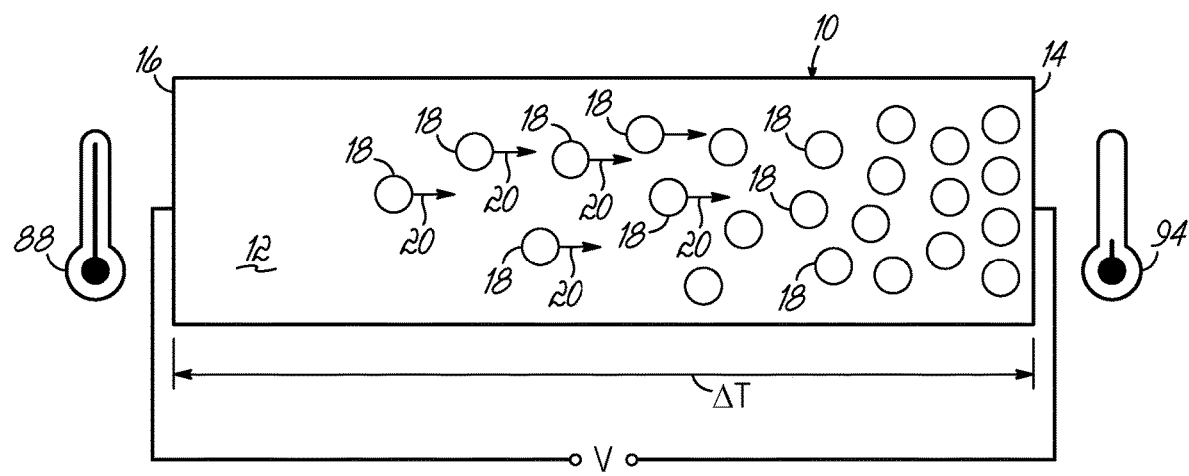
FIG. 3 is a diagrammatic view of a thermoelectric element depicting movement of charge carriers in response to a temperature gradient across the element.

FIG. 3 depicts a cross-sectional view of a thermoelectric element 10 comprising a length of thermoelectric material 12 having a cold end 14 and a hot end 16. Application of heat to the thermoelectric element 10 that produces the depicted temperature difference ΔT may cause charge carriers 18 to migrate toward and/or condense at the cold end 14 of thermoelectric material 12 as indicated by the single headed arrows 20. This phenomenon is known as the Seebeck effect.

For a thermoelectric material 12 in which the majority carriers are positive charge carriers 18 (e.g., a p-type semiconductor), the carrier migration may cause a positive voltage V to build up across the length of the thermoelectric material 12 such that the cold end 14 has a higher potential than the hot end 16. For a thermoelectric material 12 in which the majority carriers are negative charge carriers 18 (e.g., an n-type semiconductor), the carrier migration may cause a negative voltage V to build up across the thermoelectric material 12 such that the cold end 14 has a lower potential than the hot end 16. The thermopower or Seebeck coefficient α of the length of thermoelectric material 12 is provided by:

$$\alpha = \frac{-E}{\nabla T} \quad \text{Eqn. 1}$$

where E is the electric field and $\nabla T$ is the temperature gradient. Equation 1 may simplify to α=V/ΔT when the voltage V and temperature difference ΔT are measured over the same length of material. Thus, Equation 1 may be used to determine an expected voltage that will be generated by the thermoelectric element 10 given the dimensions of the element. In order to define a consistent flow of current I that is independent of the type of charge carrier, current I is defined herein as always moving in the direction of positive charge flow. Thus, in materials having negative charge carriers 18, current I flows in the opposite direction of the charge carriers 18, and in materials having positive charge carriers 18, the current I flows in the same direction as the charge carriers 18.

It is typically desirable to use a thermoelectric material 12 with a relatively large Seebeck coefficient α in order to generate a higher voltage V for a given temperature difference ΔT than would be generated by a thermoelectric material with a low Seebeck coefficient α. A typical Seebeck coefficient α for a semiconductor may have a magnitude that ranges from 200 to 300 μV/K at room temperature. The thermoelectric efficiency of a thermoelectric material can be quantified by a dimensionless figure of merit zT given by:

$$zT = \frac{\alpha^2 \sigma}{\kappa} T \quad \text{Eqn. 2}$$

where T is the average absolute temperature of the thermoelectric element 10 in kelvin, σ is the electrical conductivity of the thermoelectric material 12, κ is the thermal conductivity of the thermoelectric material 12, and each of the parameters may vary with temperature.

According to Equation 2, the thermoelectric figure of merit zT is proportional to the electrical conductivity σ and the square of the Seebeck coefficient α, and inversely proportional to the thermal conductivity κ. A low thermal conductivity κ may enable a temperature gradient $\nabla T$ to be maintained across the thermoelectric element 10 with a lower flow of heat through the thermoelectric element 10 as compared to a high thermal conductivity κ. A high electrical conductivity σ may lower the impedance of the thermoelectric element 10, thereby allowing it to source a larger amount of current I as compared to a thermoelectric element 10 with a low electrical conductivity σ.

It is normally desirable to use materials with as high of a thermoelectric figure of merit zT as possible. Useful devices may be made from thermoelectric materials with a thermoelectric figure of merit of 0.3. In contrast, a thermoelectric figure of merit of 1.0 is considered good, and a thermoelectric figure of merit of 2.0 or more is considered to be near the limit of what is possible with conventional technology. As can be seen from Equations 1 and 2, the voltage V generated by thermoelectric element 10 from a given temperature difference ΔT due to the Seebeck effect is limited by the intrinsic properties of the thermoelectric material 12, e.g., the Seebeck coefficient α, electrical conductivity σ, and thermal conductivity κ.

The temperature difference ΔT may be generated by the thermoelectric element 10 itself in response to a current I being driven through the thermoelectric element 10. Thus, the thermoelectric element 10 can be used as a heat pump by passing an externally sourced current I through the element. To generate the shown temperature difference ΔT in a thermoelectric material in which the majority carriers are positive charge carriers (e.g., holes), the current I may be driven from the cold end 14 toward the hot end 16. In contrast, to generate the shown temperature difference ΔT in a thermoelectric material in which the majority carriers are negative charge carriers (e.g., electrons), the current I may be driven from the hot end 16 toward the cold end 14.

Figure 4:
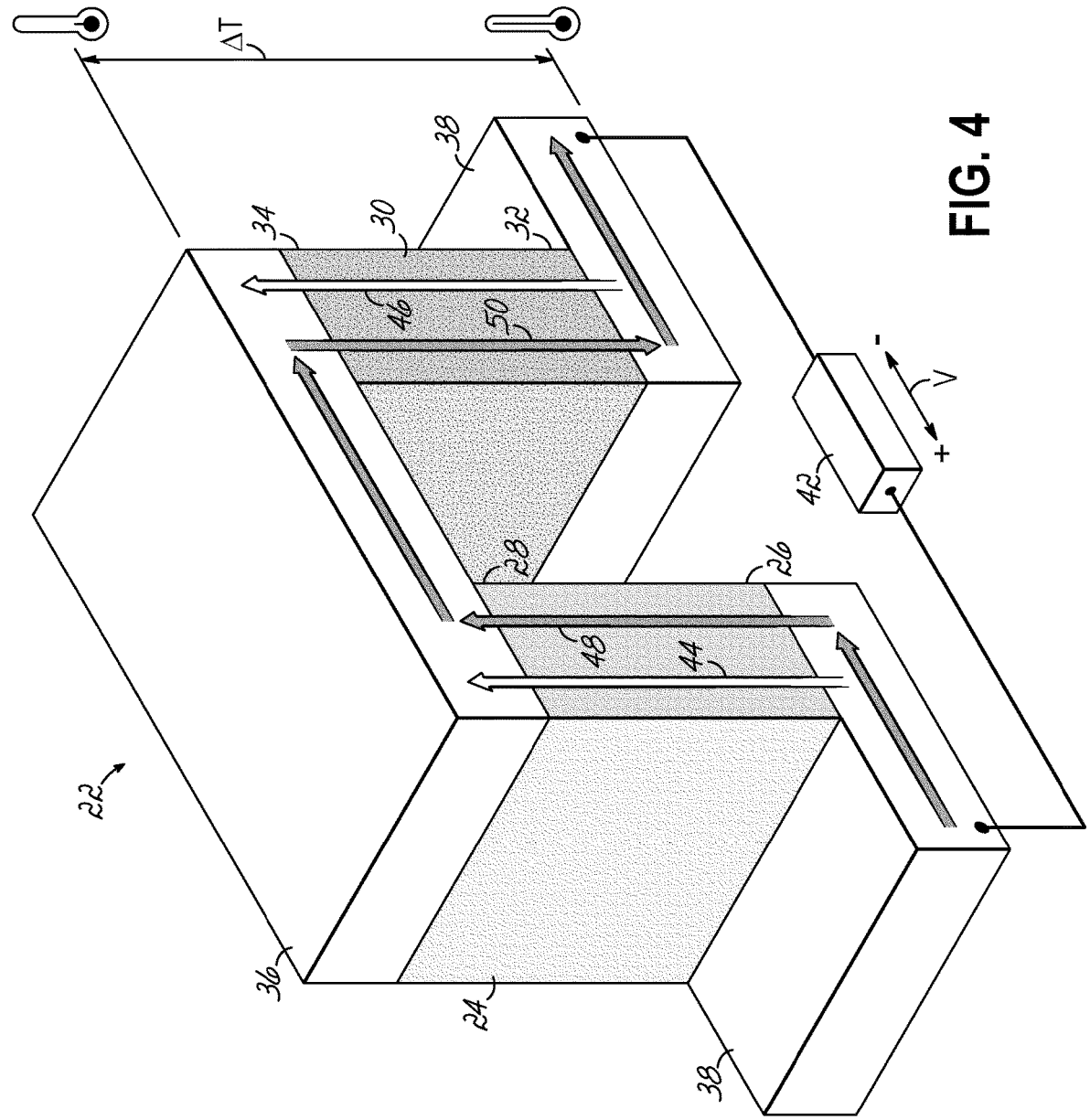
FIG. 4 is an isometric view of a longitudinal thermoelectric module that utilizes two thermoelectric elements of FIG. 3 to generate a voltage based on the Seebeck effect.

FIG. 4 depicts a thermoelectric module 22 which utilizes the Seebeck effect and has a longitudinal geometry. Thermoelectric module 22 may include a thermoelectric element 24 made of a p-type thermoelectric material having a hot end 26 and a cold end 28, a thermoelectric element 30 made of an n-type thermoelectric material having a hot end 32 and a cold end 34, an upper electrode 36 coupling the cold end 28 of thermoelectric element 24 to the cold end 34 of thermoelectric element 30, and lower electrodes 38 coupling the hot ends 26, 32 of thermoelectric elements 24, 30 to an electrical load 42. Because the depicted type of thermoelectric module 22 relies on the Seebeck effect to generate electrical power, it uses thermoelectric elements 24, 30 having different types of charge carriers and has an electrical output that scales intrinsically with the properties of the thermoelectric materials used in the thermoelectric elements 24, 30.

Application of a temperature difference ΔT across the thermoelectric module 22 may cause heat to flow from the hot ends 26, 32 to the cold ends 28, 34 of thermoelectric elements 24, 30, as indicated by single headed arrows 44, 46. The resulting temperature gradient ∇T may cause a flow of positive charge carriers from the hot end 26 to the cold end 28 of thermoelectric element 24 that results in a positive current flow toward the cold end 28, as indicated by single headed arrow 48. The temperature gradient ∇T may also cause a flow of negative charge carriers from the hot end 32 to the cold end 34 of thermoelectric element 30 that results in a positive current flow toward the hot end 32 as indicated by single headed arrow 50. The electrodes 36, 38 may be configured to complete the circuit, thereby allowing current to flow through the thermoelectric module 22 and electrical load 42.

Figure 5A:
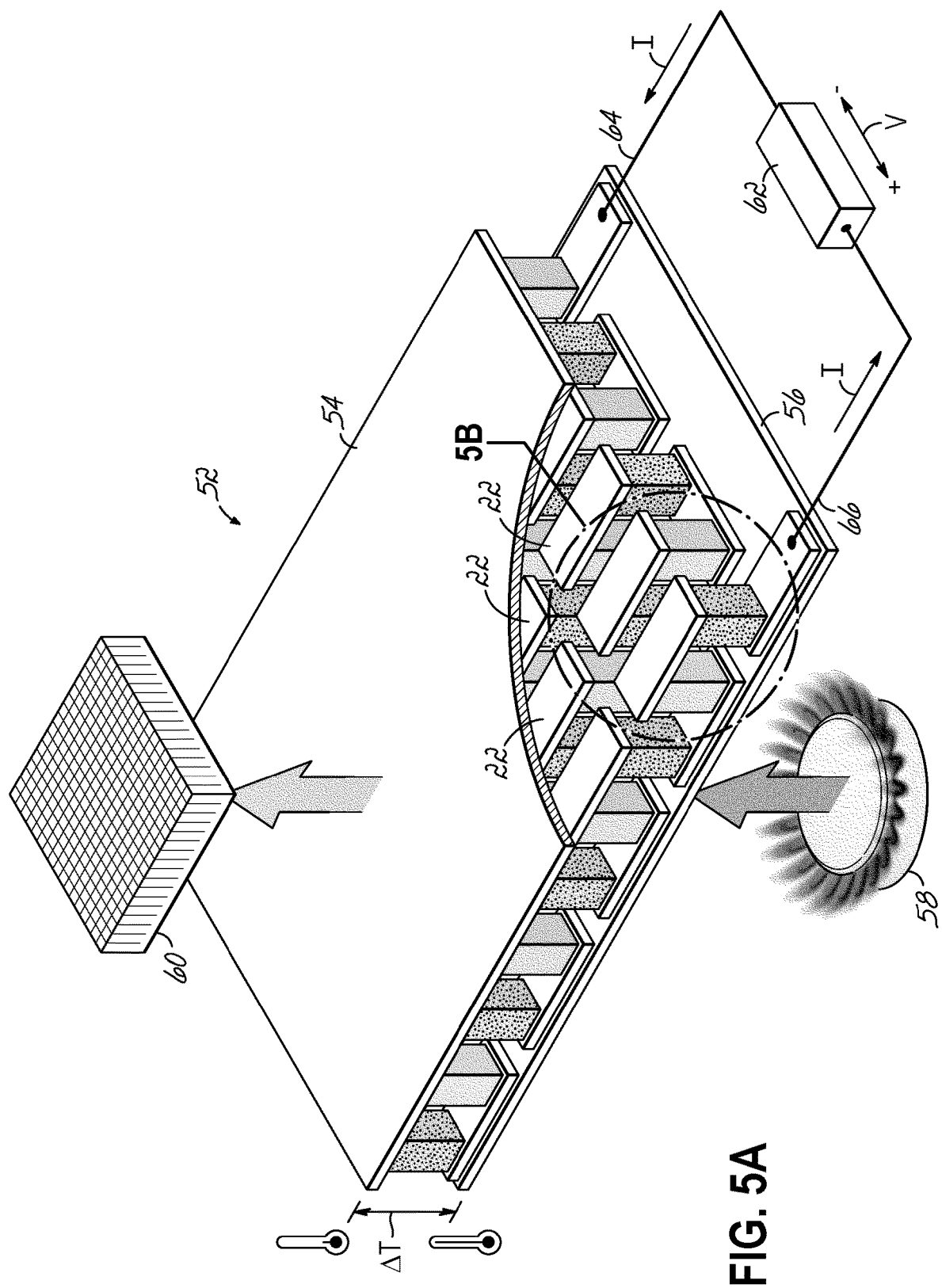
FIG. 5A is an isometric view of a thermoelectric generator including a plurality of the thermoelectric modules of FIG. 4.
Figure 5B:
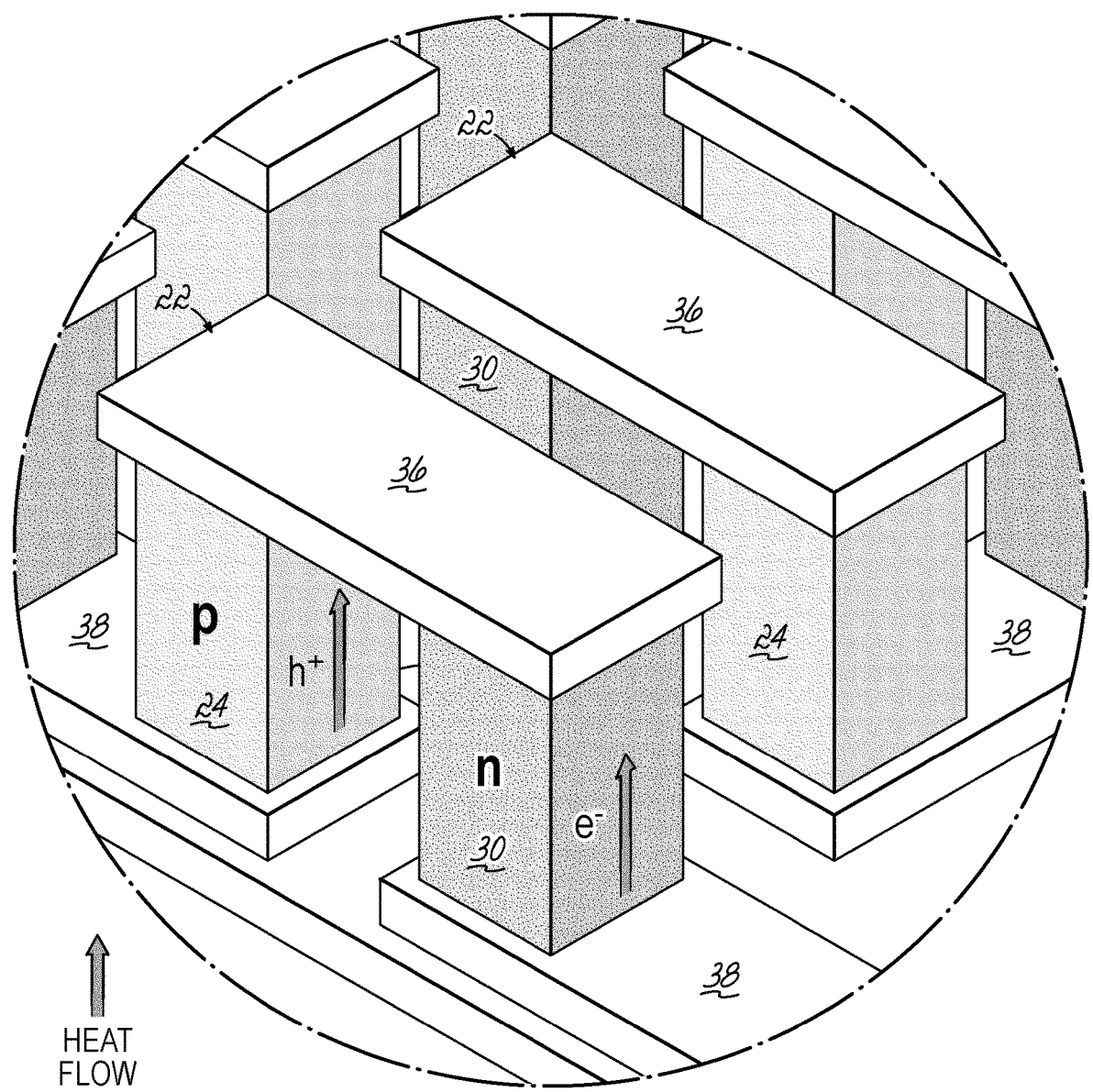
FIG. 5B is an enlarged view of a portion of the thermoelectric generator of FIG. 5A showing additional details thereof.

Because the voltage generated by thermoelectric module 22 is limited by the intrinsic properties of the thermoelectric materials from which it is made, thermoelectric generators using a longitudinal geometry are typically assembled from a large number of modules in order to produce a useful output voltage. FIGS. 5A and 5B depict an exemplary thermoelectric generator 52 including a plurality of thermoelectric modules 22 electrically coupled in a series configuration. The upper electrodes 36 of thermoelectric modules 22 are thermally coupled to an upper substrate 54, and the lower electrodes 38 of thermoelectric modules 22 are thermally coupled to a lower substrate 56. The thermoelectric modules 22 are thus thermally coupled to the upper and lower substrates 54, 56 in parallel. The substrates 54, 56 may be made from a material that has a low electrical conductivity, or is electrically isolated from the electrodes 36, 38 by an electrically insulating layer (not shown), in order to avoid shorting out the thermoelectric generator 52.

One of the substrates 54, 56 (e.g., the lower substrate 56) may be thermally coupled to a heat source 58 (e.g., the exhaust from combustion used to heat a boiler), and the other substrate 54, 56 (e.g., the upper substrate 54) may be thermally coupled to a heat sink 60 (e.g., a cooling medium such as the atmosphere or a reservoir of water). Thermally coupling the thermoelectric generator 52 between a heat source and a heat sink as described above may cause a temperature difference ΔT to develop across each of the thermoelectric modules 22. The resulting temperature gradient ∇T in thermoelectric elements 24, 30 may in turn cause each thermoelectric module 22 to generate a voltage. The electrodes 36, 38 of thermoelectric modules 22 may be configured to electrically couple the thermoelectric modules 22 in a series configuration so that the voltages generated by the thermoelectric modules 22 add constructively to generate an output voltage V that causes a current I to flow through an electrical load 62 coupled to output terminals 64, 66 of thermoelectric generator 52.

Figure 6:
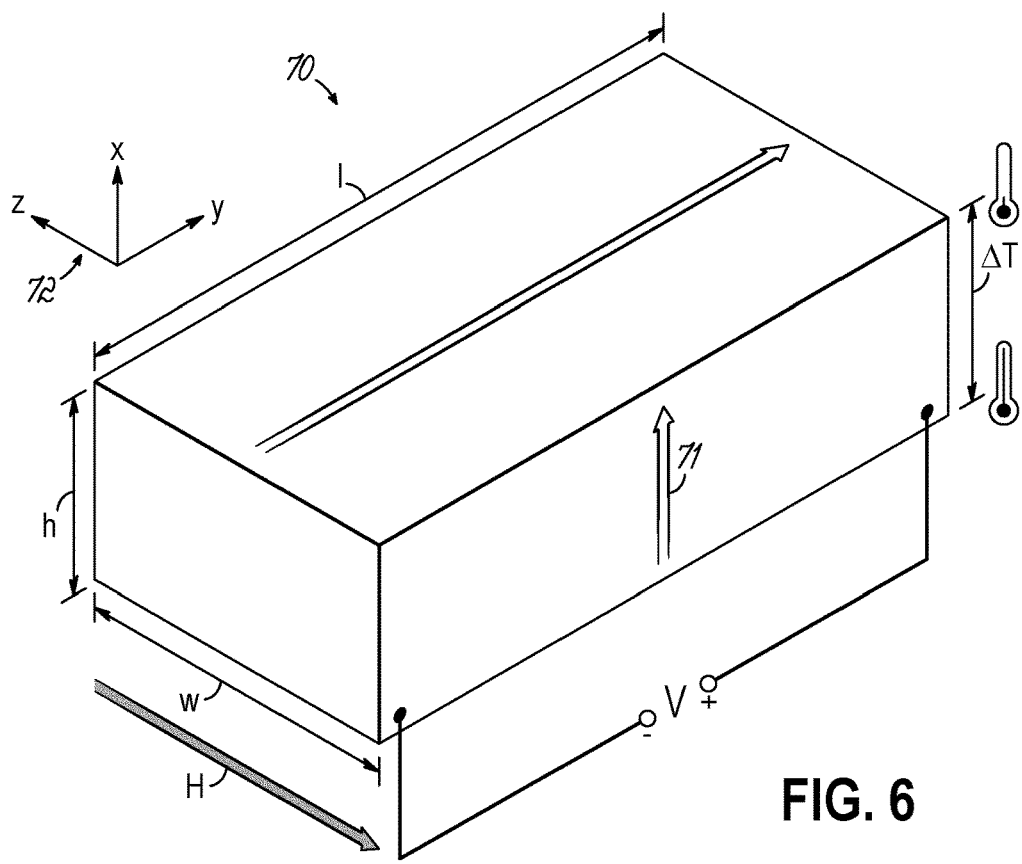
FIG. 6 is an isometric view of a transverse thermoelectric element that utilizes the Nernst effect to generate a voltage from a temperature gradient.

FIG. 6 depicts a thermoelectric element 70 having a transverse geometry that utilizes the Nernst effect to generate a voltage from a temperature difference ΔT. The thermoelectric element 70 may include a height dimension h that generally corresponds with an x-axis of a three-dimensional coordinate system 72, a length dimension l that generally corresponds with a y-axis of coordinate system 72, and a width dimension w that generally corresponds with a z-axis of coordinate system 72.

To generate a voltage V across the length l of thermoelectric element 70, the Nernst effect requires a force that urges charge carriers in a direction orthogonal (i.e., perpendicular) to the temperature gradient ∇T produced by temperature difference ΔT across the element, e.g., orthogonal to the height h of thermoelectric element 70. In conventional devices, this force is a Lorentz force resulting from the cross-product of the temperature gradient ∇T and a magnetic field H applied in a direction orthogonal to both the temperature gradient ∇T and the voltage gradient ∇V generated by the device. For the thermoelectric element 70 depicted in FIG. 6, this magnetic field H may be generally parallel to the z-axis of coordinate system 72.

As carriers move toward the cold side of the thermoelectric element 70 under the influence of the temperature gradient ∇T (as indicated by single headed arrow 71), the magnetic field H may generate forces on the carriers that urge positive and negative charge carriers in opposite directions. For the depicted temperature difference ΔT and magnetic field H, this force may urge positive charge carriers in a positive direction along the y-axis and negative charge carriers in a negative direction along the y-axis. The movement of the charge carriers in thermoelectric element 70 under the influence of the temperature gradient ∇T and magnetic field H may thereby produce a voltage V across the thermoelectric element 70 having the shown polarity.

In contrast to the output of thermoelectric module 22, which is limited by the intrinsic properties of the materials from which it is made, the output of thermoelectric element 70 scales with the size of the device. Advantageously, this allows the voltage V generated by thermoelectric element 70 to be scaled by simply adjusting its dimensions. Thus, thermoelectric generators based on this type of element may avoid the complexity of assembling a large number of thermoelectric elements as shown in FIG. 5. However, because the magnetic field H required to generate useful amounts of electricity is typically quite large, conventional thermoelectric elements utilizing a transverse geometry and the Nernst effect are generally not suitable for power recovery from waste heat or other practical commercial applications.

Embodiments of the invention advantageously reduce or eliminate the need to provide a magnetic field H to thermoelectric elements utilizing the Nernst effect by using materials having a non-zero Berry curvature, such as certain Weyl semimetals. A Weyl semimetal is a solid-state crystal having low energy excitations that comprise Weyl fermions which carry electrical charge. It has been determined that Weyl semimetals having a non-zero integral over the Fermi surface of the projection of the Berry curvature $\Omega_z$ of the dispersion relation of their conduction electrons along a specific crystallographic axis can be used to create or increase Nernst thermopower $\alpha_{xyz}$.

This property may enable materials having a non-zero Berry curvature to generate a thermoelectric voltage along a direction orthogonal to the direction of an applied temperature gradient without an externally applied magnetic field. Thermoelectric devices made using materials having a non-zero Berry curvature may be used to generate power and/or pump heat, and thus may have wide-ranging applications in many industries, such as the energy and electronics industries.

The origin of this thermoelectric effect is believed to lie in the presence of a non-zero Berry curvature of the electronic band structure at each electron energy and momentum value. A Berry curvature may be produced by an electronic band structure that exhibits spin-orbit canting, which may cause the material having the canted spin-orbit to exhibit a non-zero magnetic moment. The ability of a Weyl semimetal to generate voltages as described above may depend on the integral of the projection of the Berry curvature over the Fermi surface being non-zero. One way this may occur is when electrons in the solid break time-reversal symmetry. The Weyl nodes act as monopole sources (or sinks) of the Berry curvature. This Berry curvature acts as an effective magnetic field that exists in the electrons' momentum-space, introducing an anomalous velocity to electron motion that is skew to both the Berry curvature and the electrons' momentum. This skew force is believed to generate a non-zero thermoelectric power in a direction orthogonal to both the net Berry curvature integrated over the whole Fermi surface and the direction of the applied temperature gradient. This effect has been observed experimentally in the compound $YbMnBi_2$, which is a Weyl semimetal that breaks time-reversal symmetry and is a canted antiferromagnet material having a net Berry curvature $\Omega_Z$ along its [110] crystal axis.

Figure 7:
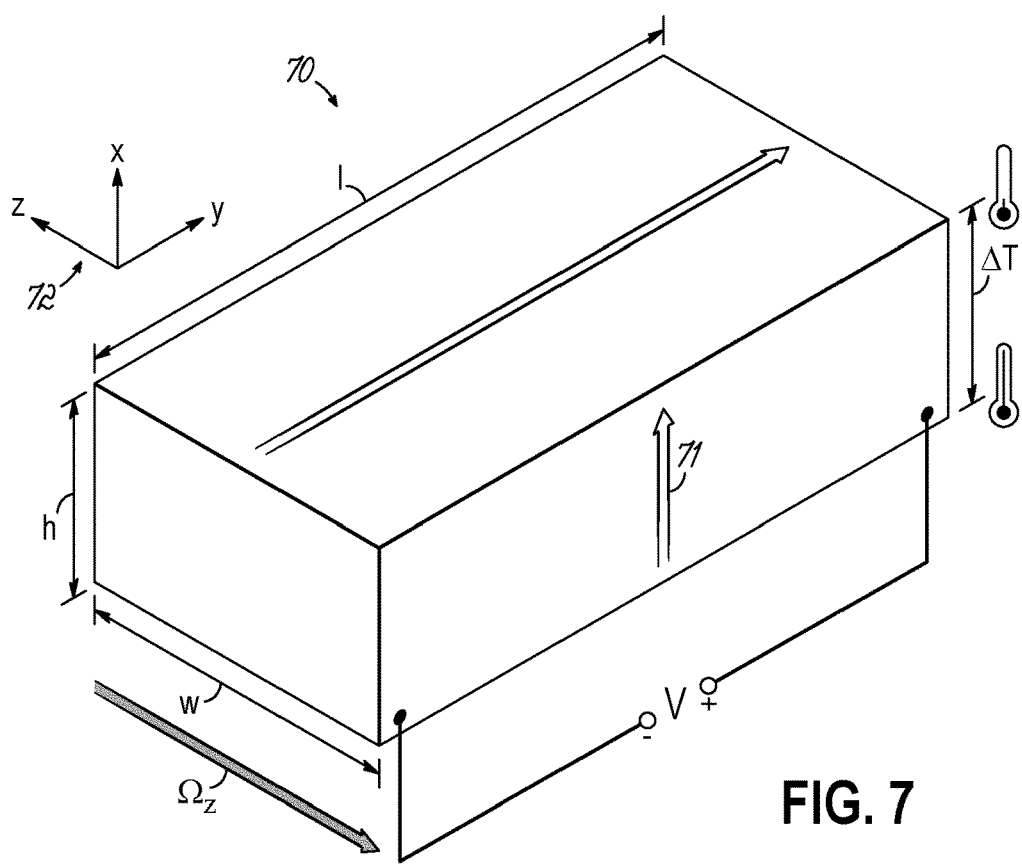
FIG. 7 is an isometric view of the thermoelectric element of FIG. 6 showing a spatial relationship between a crystallographic axis of the thermoelectric element along which a non-zero Berry curvature exists, the temperature gradient applied to the thermoelectric element, and the voltage produced by the thermoelectric element.

By aligning the [110] crystal axis of a $YbMnBi_2$ crystal with the z-axis as depicted in FIG. 7, the above described effect may be used to produce transverse thermoelectric devices, namely Nernst generators and their thermodynamic reciprocal, Ettingshausen coolers. Unlike classical Nernst generators and Ettingshausen coolers, thermoelectric devices made with materials having a non-zero Berry curvature do not require an external magnetic field H, the role of which is provided by the Berry curvature $\Omega_z$. An external magnetic field can, however, still be applied, and its presence can be used to adjust (e.g., reinforce or counteract) the effect of the Berry curvature in certain circumstances.

Transverse thermoelectric devices such as shown in FIG. 7 have several advantages over classical Peltier devices, such as the thermoelectric modules and generator shown in FIGS. 4 and 5. Because the electrodes applied to the thermoelectric material can lie in an isothermal plane of a transverse device, the electrodes can both be applied at either the hot end or the cold end of the device. That is, there is no need to return the current from the hot end to the cold end of the device. Thus, there is no need for a thermocouple pair, with a p-type material carrying the current from hot to cold and an n-type material carrying the current back from cold to hot.

Transverse thermoelectric devices have several advantages over conventional, longitudinal thermoelectric devices. For example, there is no need to simultaneously develop n-type and p-type thermoelectric materials with similar temperature dependences in their zT values. One material with one polarity suffices for the entire device. Another advantage is that there is no need to connect several thermocouples together electrically in series and thermally in parallel as must be done in thermoelectric modules and Peltier devices. Rather, in Nernst generators and Ettingshausen coolers, the current capacity and the voltage rating can be increased by simply increasing the physical size of the thermoelectric material in the device. More advantageously, having one pair of current contacts and one pair of thermal contacts may allow the parasitic losses in contact resistances of thermoelectric modules and Peltier devices to be decreased as compared to Seebeck effect-based devices using series electrical couplings.

The temperature difference in classical Peltier devices may be limited by the following equation:

$$\Delta T_{max} = \frac{1}{2} \times (zT \times T_{cold}) \qquad \text{Eqn. 3}$$

Therefore, when larger temperature drops are required in a Peltier device, several Peltier elements are typically connected in cascaded coolers. This increases the complexity of devices aimed at generating cooling over large temperature gradients, especially in cryogenic cooling applications. However, these limitations in the maximum temperature gradient do not hold for Nernst/Ettingshausen devices. Therefore, Nernst/Ettingshausen devices can operate with large temperature gradients without cascading series connections.

The large transverse Nernst thermopower $\alpha_{xyz}$ of Weyl semimetals has been demonstrated experimentally using $YbMnBi_2$. The peak in the Nernst thermopower $\alpha_{xyz}$ of $YbMnBi_2$ in the absence of a magnetic field is approximately 1000 μV/K near 50K and 30 μV/K near room temperature. By way of comparison, commercially available thermoelectric materials have a Seebeck coefficient $\alpha_{xxz}$ near 200-300 μV/K at room temperature. The transverse thermoelectric figure of merit zT may be calculated using Equation 4 below:

$$zT_{xy} = \frac{(\alpha_{xyz})^2 \times \sigma_{yy}}{\kappa_{xx}} \times T \qquad \text{Eqn. 4}$$

where $\alpha_{xyz}$ is the Nernst thermopower, $\sigma_{yy}$ is the electrical conductivity in the direction parallel to the measured voltage, and $\kappa_{xx}$ is the thermal conductivity in the direction parallel to the applied and measured temperature gradient.

For $YbMnBi_2$, the transverse zT in the absence of a magnetic field is estimated to be 2.42 at 59.55 K. This value is greater than that of any other known thermoelectric for this low of a temperature range, and for a transverse geometry (i.e. Nernst or Ettingshausen geometry) at any temperature. The performance of this new thermoelectric material, which is based on new physical principles, enables the novel approach to solid-state cryogenic cooling provided by embodiments of the invention, and may be useful in numerous cooling applications. For example, a number of detectors including infra-red detectors, focal plane arrays, and x-ray and gamma-ray detectors, could benefit from Ettingshausen coolers using thermoelectric elements having a non-zero Berry curvature.

Figure 8:
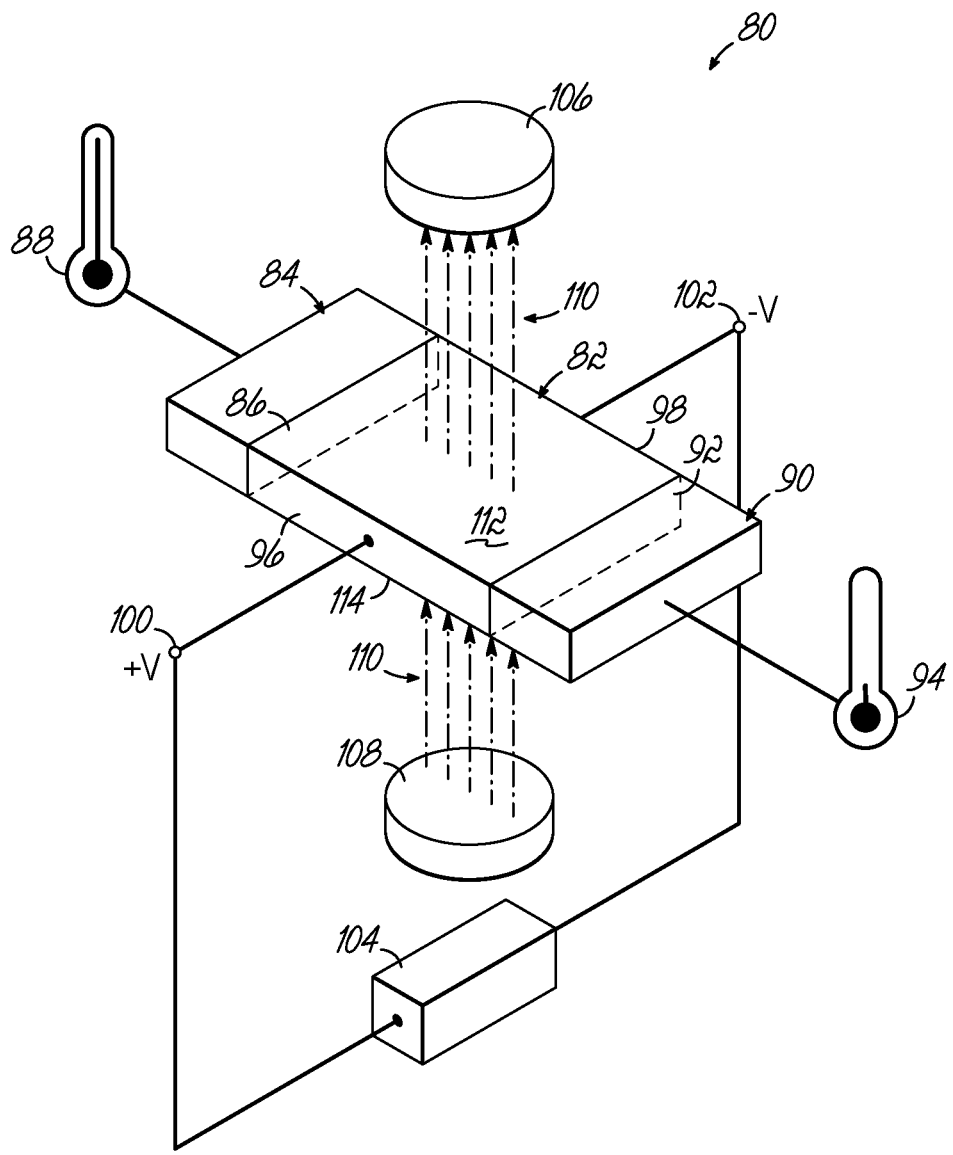
FIG. 8 is a diagrammatic view of an exemplary transverse thermoelectric generator, or Nernst generator, including the thermoelectric element of FIG. 7.

FIG. 8 depicts an exemplary thermoelectric device 80 in accordance with an embodiment of the invention. The thermoelectric device 80 may include a thermoelectric element 82 comprising a material having a non-zero Berry curvature, a thermal coupler 84 configured to couple a hot side 86 of the thermoelectric element 82 to a heat source 88, and a thermal coupler 90 configured to couple a cold side 92 of the thermal element to a heat sink 94. The thermoelectric element 82 may be configured so that an axis of the material having the non-zero Berry curvature is generally orthogonal to the temperature and voltage gradients. Voltage output sides 96, 98 of thermoelectric element 82 may be electrically coupled to respective terminals 100, 102 to facilitate connection of the thermoelectric device 80 to an electrical load 104. The thermoelectric device 80 may also include one or more magnets 106, 108 configured to provide a magnetic flux 110 to the thermoelectric element 82. The magnetic flux 110 may enter and exit the thermoelectric element 82 through the remaining sides 112, 114, and may be generally aligned with the axis having the non-zero Berry curvature. The magnetic flux 110 may be used to adjust (e.g., reinforce or counteract) the effect of the Berry curvature, thereby providing a mechanism for controlling the output and/or efficiency of the thermoelectric device 80.

EXPERIMENTAL RESULTS

Figure 9:
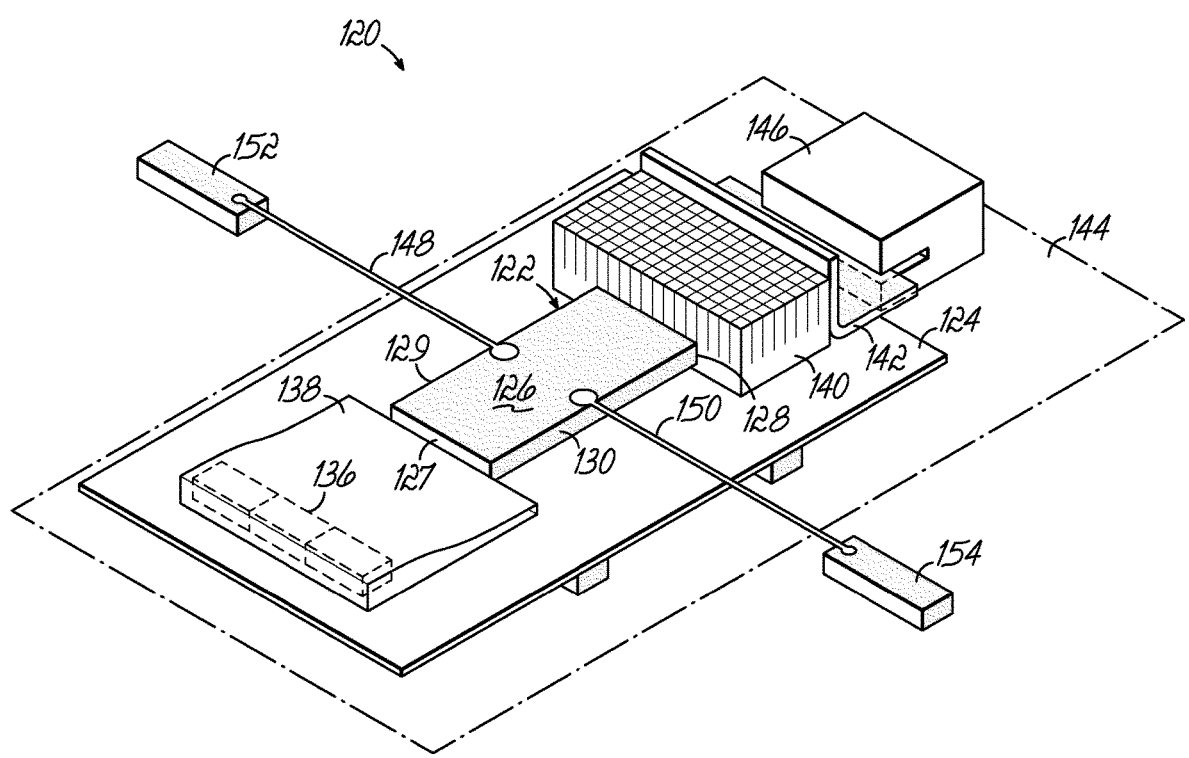
FIG. 9 is an isometric view of a thermoelectric test device used to collect Nernst effect performance data on the thermoelectric element of FIG. 7.

FIG. 9 depicts a test device 120 including a thermoelectric element 122 comprising $YbMnBi_2$. The thermoelectric element 122 is affixed to a silicon substrate 124. The thermoelectric element 122 includes an outward facing surface 126 having a rectangular shape that faces away from the substrate 124, and a downward facing surface (not shown) generally parallel to and spaced about 0.44 mm from the outward facing surface 126. The thermoelectric element 122 is oriented so that the [110] crystal axis of the YbMnBi$_2$ (and thus the non-zero Berry curvature) is orthogonal (i.e., normal) to the outward and downward facing surfaces, e.g., projecting outward from the outward facing surface 126. The rectangular shape of outward facing surface 126 is defined by a left facing surface 127, a right facing surface 128 generally parallel to and about 2.58 mm from the left facing surface 127, a top facing surface 129 that intersects the left and right facing surfaces 127, 128, and a bottom facing surface 130 generally parallel to and 1.85 mm from the top facing surface 129. Each of the surfaces 127-130 is generally orthogonal to the outward facing and downward facing surfaces so that the thermoelectric element 122 generally forms a polyhedron having six sides and dimensions of 0.44 by 1.85 by 2.58 mm.

The left facing surface 127 of thermoelectric element 122 is thermally coupled to a resistive heater 136 by a copper foil heat spreader 138. The heat spreader 138 is configured to provide heat generated by the resistive heater 136 evenly to the left facing surface 127 of thermoelectric element 122. The right facing surface 128 of thermoelectric element 122 is coupled to a copper foil heat sink 140. When the resistive heater 136 is energized, a temperature gradient forms having a decreasing temperature across the thermoelectric element 122 from the left facing surface 127 to the right facing surface 128. A gold-plated copper bracket 142 attached to (e.g., epoxied to) the heat sink 140 and substrate 124 holds the test device 120 in place with respect to the substrate 124. A clamp 146 holds the bracket 142 in place relative to a base 144 so that the substrate 124 is suspended above the base 144. The bracket 142 is in thermal contact with the heat sink 140, and thermally and electrically isolated from the base 144. Insulated copper leads 148, 150 electrically couple the top and bottom surfaces 129, 130 to respective terminals 152, 154 that facilitate measuring voltages V and/or currents I generated by or provided to the thermoelectric element 122.

Figure 10:
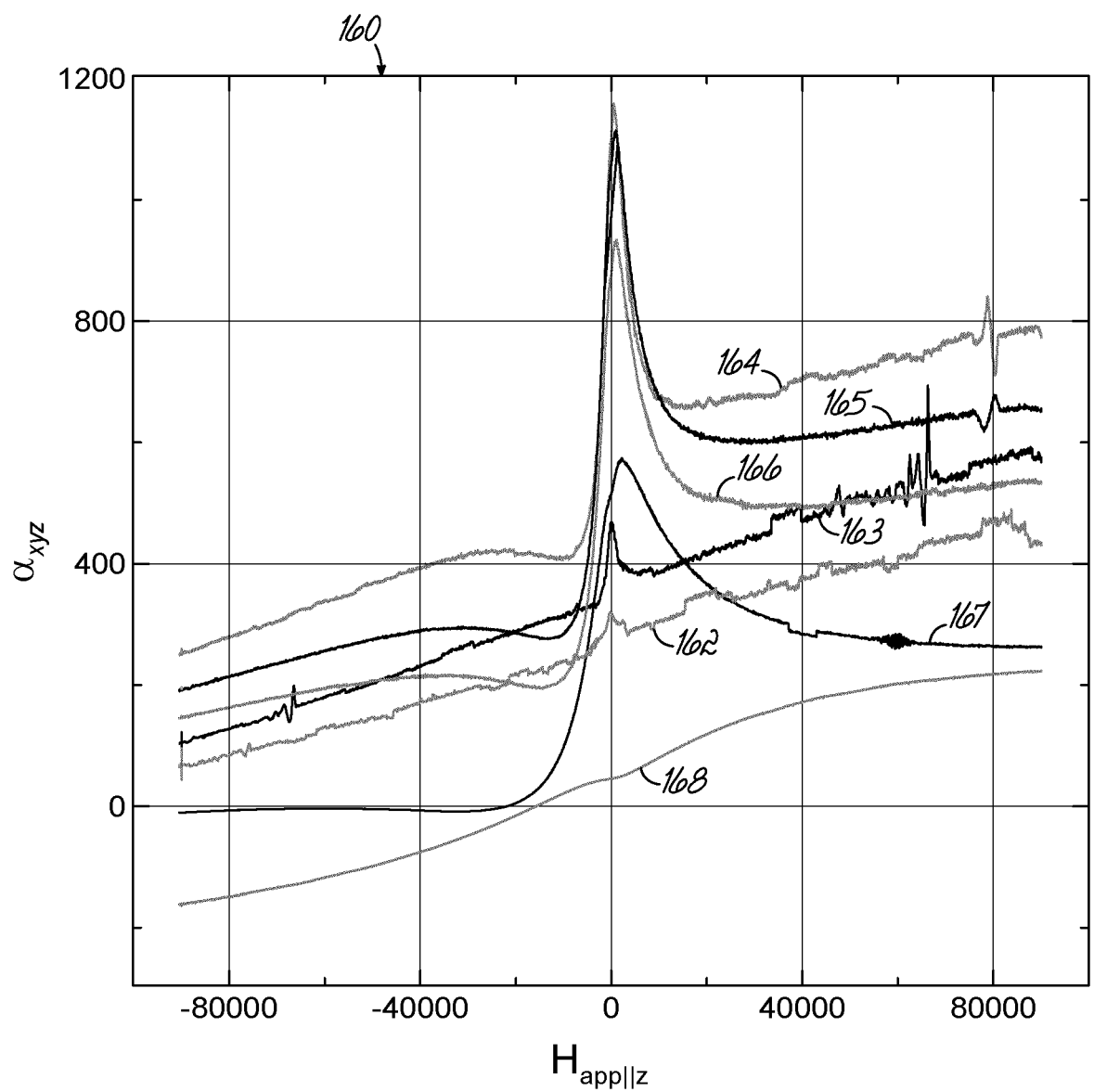
FIG. 10 is graphical view illustrating the Nernst thermopower verses applied magnetic field at different operating temperatures.

FIG. 10 depicts a graph 160 including plots 162-168 of the Nernst thermopower $\alpha_{xyz}$ in µV/K verses magnetic field strength H in Oersteds (Oe). The data used to define plots 162-168 was measured using the test device 120 at sample temperatures of 15.86 K (plot 162), 23.17 K (plot 163), 41.48 K (plot 164), 59.44 K (plot 165), 75.15 K (plot 166), 118.4 K (plot 167), and 323.1 K (plot 168). The plots 162-168 illustrate the Nernst Effect in YbMnBi$_2$. The magnetic field was applied along an axis orthogonal to the outward facing surface 126 of thermoelectric element 122, which is aligned with the [110] crystallographic axis and is thus the direction of the expected non-zero Berry curvature. Positive values of H indicate the field is oriented in an outward facing direction with respect to the outward facing surface 126 as depicted in FIG. 8. As can be seen from plot 128, the Nernst thermopower $\alpha_{xyz}$ has a non-zero value in the absence of an externally applied magnetic field that is significantly larger than that produced by conventional thermoelectric materials.

Figure 11:
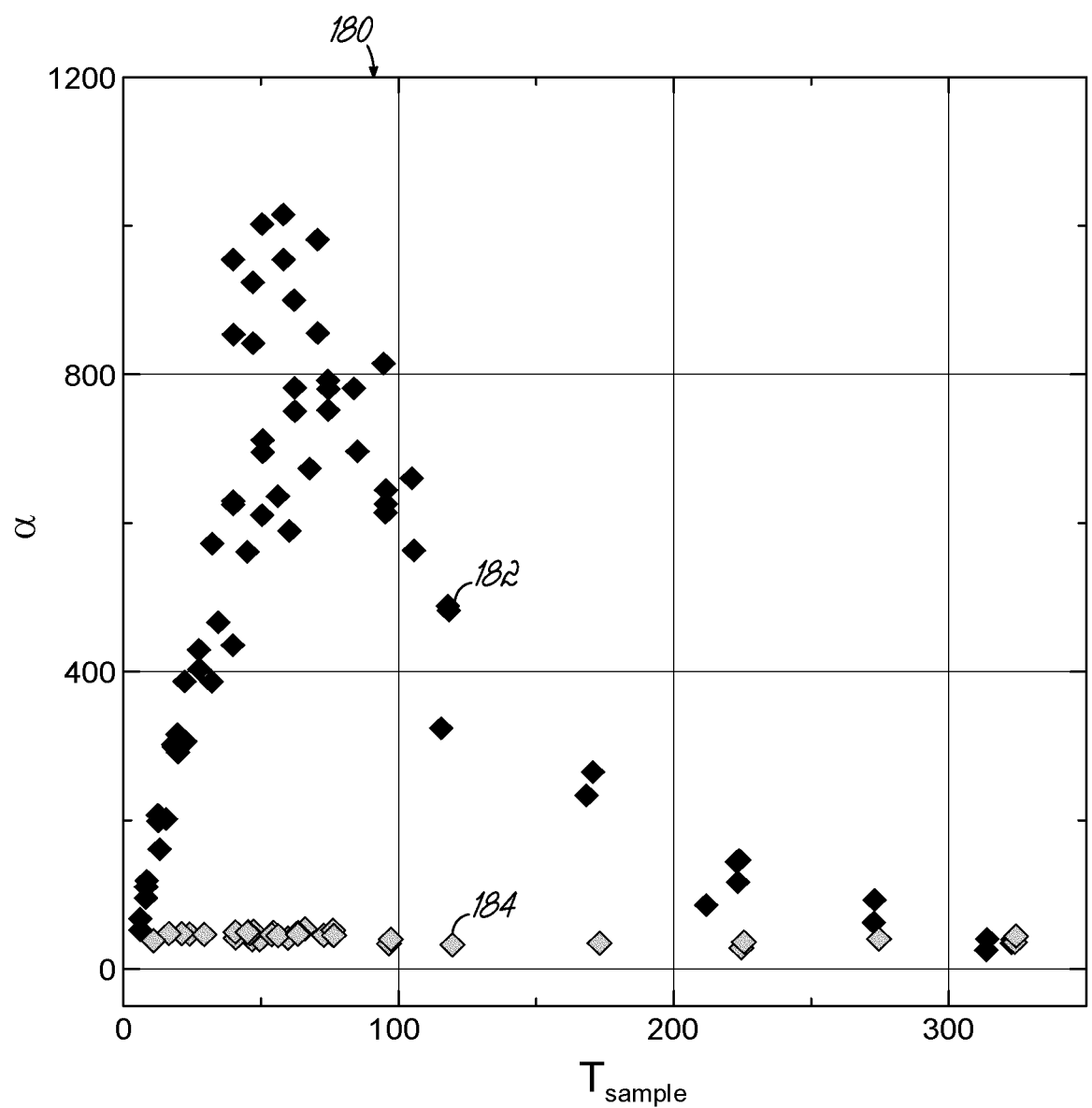
FIG. 11 is graphical view illustrating Nernst thermopower as a function of temperature in the absence of an applied magnetic field for a thermoelectric element having a transverse geometry.

FIG. 11 depicts a scatter plot 180 including data points 182 illustrating the Nernst thermopower $\alpha_{xyz}$ in µV/K verses the temperature of the thermoelectric element 122 in kelvin for a transverse geometry (i.e., produced by the Nernst effect), and data points 184 illustrating the Seebeck coefficient $\alpha_{xxz}$ in µV/K verses the temperature of the thermoelectric element 122 in kelvin for a longitudinal geometry (i.e., produced by the Seebeck effect) in the absence of an externally applied magnetic field. The data points 182, 184 were extracted from data taken without an externally applied magnetic field. In the absence of a Berry curvature, the Nernst thermopower $\alpha_{xyz}$ indicated by data points 182 would be expected to be 0 µN/K at all temperatures. Thus, the non-zero values shown for the Nernst thermopower $\alpha_{xyz}$ indicate the presence of a Berry curvature and confirm the effect of the Berry curvature on the Nernst thermopower $\alpha_{xyz}$, which is significantly larger than would be expected for conventional thermoelectric materials configured in a transverse geometry. The disparity between the coefficients $\alpha_{xyz}$ and $\alpha_{xxz}$ produced by the Nernst and Seebeck effects support the conclusion that a non-zero Berry curvature produces the Nernst effect even in the absence of an externally applied magnetic field.

The conventional thermoelectric figure of merit, zT, may be calculated using Equation 5 below:

$$zT = \frac{\alpha_{xx}^2 \times \sigma_{xx}}{\kappa_{xx}} T = \frac{\alpha_{xx}^2}{\kappa_{xx}\rho_{xx}} \qquad \text{Eqn. 5}$$

where $\rho_{xx}$ is the resistivity of the thermoelectric material. The maximum value of zT known by the Applicant to have been measured in a laboratory is 2.2 at 915 K. The transverse figure of merit zT may be calculated using Equation 6:

$$zT_{xy} = \frac{\alpha_{xy}^2 \times \sigma_{yy}}{\kappa_{xx}} T = \frac{\alpha_{xy}^2}{\kappa_{xx}\rho_{yy}} = \frac{\alpha_{xy}^2}{\kappa_{xx}\rho_{xx}} \qquad \text{Eqn. 6}$$

Figure 12:
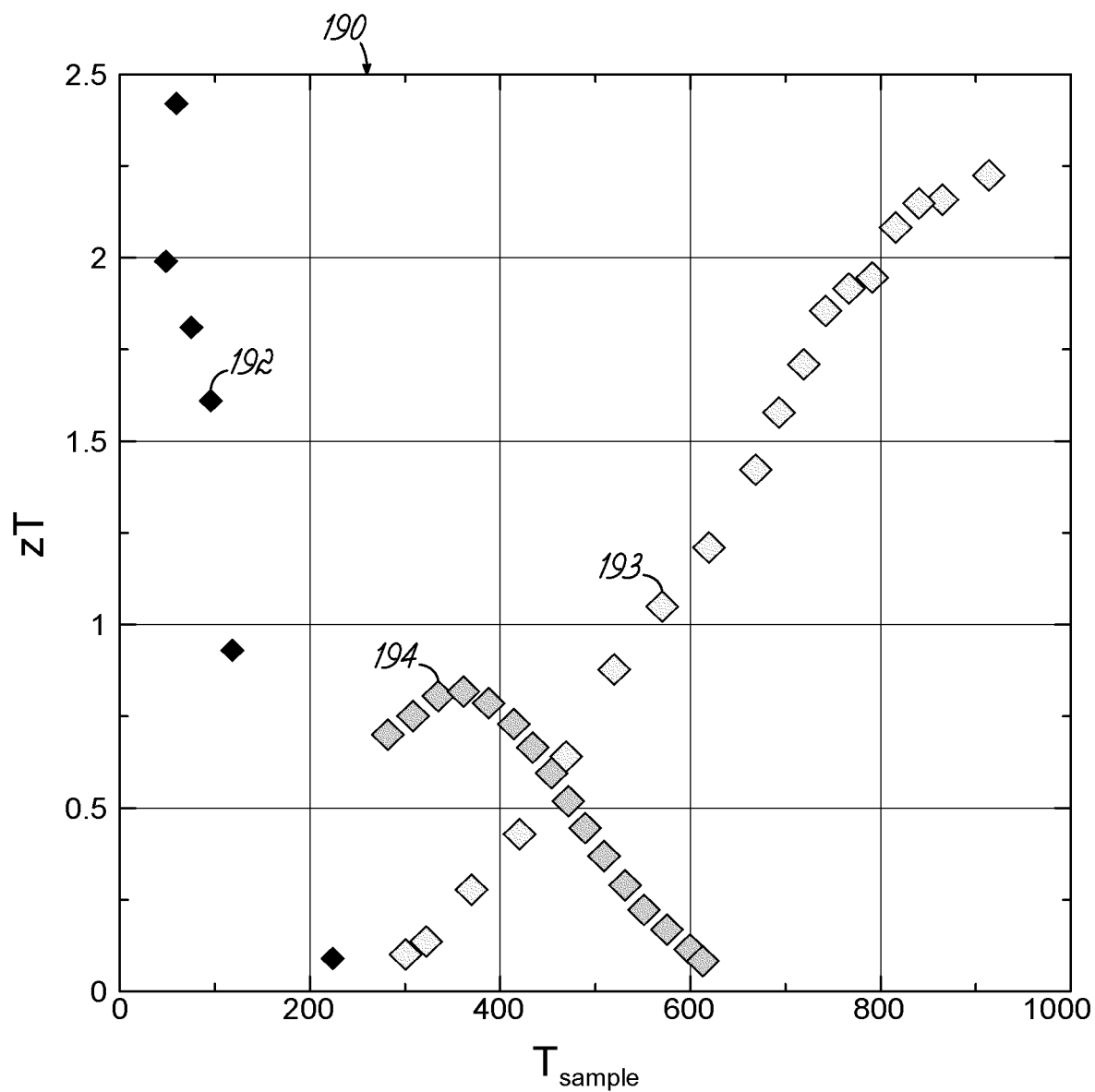
FIG. 12 is a graphical view illustrating thermoelectric figures of merit verses temperature for different thermoelectric materials in transverse and longitudinal configurations without an externally applied magnetic field.

FIG. 12 depicts a scatter plot 190 including data points 192-194 showing figures of merit zT for different thermoelectric materials in the absence of an external magnetic field. Data points 192 illustrate the transverse figure of merit zT verses temperature in kelvin for YbMnBi$_2$ in a Nernst/Ettingshausen configuration. Data points 193 illustrate the longitudinal figure of merit zT verses temperature in kelvin for PbTe doped with 2 mol % Na and nanostructured with 4 mol % SrTe. Data points 194 illustrate the longitudinal figure of merit zT verses temperature in kelvin for commercially available Bi$_2$Te$_3$.

The depicted properties of YbMnBi$_2$ provide experimental support for the improved performance of thermoelectric devices in accordance with embodiments of the invention. Use of materials having a non-zero Berry curvature, such as YbMnBi$_2$, in fabricating thermoelectric devices allows a simpler transverse geometry that operates without an externally applied magnetic field. Moreover, the peak zT of YbMnBi$_2$ occurs in a temperature range appropriate for cooling (e.g., zT=2.42 at 59.55K). Thus, thermoelectric devices using materials such as YbMnBi$_2$ may be suitable for use in both power recovery applications and for heat pumps that cryogenically cool electronic devices.

The terminology used herein is for the purpose of describing particular embodiments only and is not intended to be limiting of the embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, actions, steps, operations, elements, and/or components, but do not preclude the presence or addition of one or more other features, integers, actions, steps, operations, elements, components, and/or groups thereof. Furthermore, to the extent that the terms "includes", "having", "has", "with", "comprised of", or variants thereof are used in either the detailed description or the claims, such terms are intended to be inclusive in a manner similar to the term "comprising".

While all the invention has been illustrated by a description of various embodiments, and while these embodiments have been described in considerable detail, it is not the intention of the Applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the Applicant's general inventive concept.

What is claimed is:

1. A thermoelectric device comprising:
    a thermoelectric element having a first axis and including ytterbium manganese dibismuth (YbMnBi$_2$) having a non-zero Berry curvature along a [110] crystal axis thereof, the [110] crystal axis being aligned with the first axis, a first side, a second side located a first distance from the first side along a first dimension generally orthogonal to the first axis, a third side that intersects the first and second sides, and a fourth side located a second distance from the third side along a second dimension generally orthogonal to the first axis and the first dimension and that intersects the first and second sides;
    a first thermal coupler configured to thermally couple the first side to one of a heat source or a heat sink;
    a second thermal coupler configured to thermally couple the second side to the other of the heat source or the heat sink;
    a first electrode electrically coupled to the third side; and
    a second electrode electrically coupled the fourth side,
    wherein an internally generated temperature gradient is generated between the first and second sides in response to passing an externally sourced current between the first electrode and the second electrode, and
    a voltage is generated between the third and fourth sides in response to application of an externally sourced temperature gradient between the first thermal coupler and the second thermal coupler.

2. The thermoelectric device of claim 1 wherein the first axis of the material is orthogonal to the externally sourced temperature gradient to which the thermoelectric element is exposed or the internally generated temperature gradient the thermoelectric element generates.

3. The thermoelectric device of claim 1 further comprising:
    a magnet configured to provide a magnetic field to the thermoelectric element.

4. The thermoelectric device of claim 1 wherein the thermoelectric device is one of an Ettingshausen cooler or a Nernst generator.

5. The thermoelectric device of claim 1, wherein an external magnetic field is not applied to the thermoelectric element.

* * * * *

UNITED STATES PATENT AND TRADEMARK OFFICE
CERTIFICATE OF CORRECTION

PATENT NO. : 11,011,692 B2
APPLICATION NO. : 16/157522
DATED : May 18, 2021
INVENTOR(S) : Joseph P. Heremans et al.

Page 1 of 1

It is certified that error appears in the above-identified patent and that said Letters Patent is hereby corrected as shown below:

In the Specification

Column 4, Line 20, "FIG. 10 is graphical view illustrating the" should be --FIG. 10 is a graphical view illustrating the--.

Column 4, Line 24, "FIG. 11 is graphical view illustrating" should be --FIG. 11 is a graphical view illustrating--.

In the Claims

Column 14, Line 7, Claim 1, "a second electrode electrically coupled the fourth side," should be --a second electrode electrically coupled to the fourth side,--.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*